(12) United States Patent
Rabkin et al.

(10) Patent No.: US 6,818,504 B2  
(45) Date of Patent: Nov. 16, 2004

(54) PROCESSES AND STRUCTURES FOR SELF-ALIGNED CONTACT NON-VOLATILE MEMORY WITH PERIPHERAL TRANSISTORS EASILY MODIFIABLE FOR VARIOUS TECHNOLOGIES AND APPLICATIONS

(75) Inventors: Peter Rabkin, Cupertino, CA (US); Hsingya Arthur Wang, San Jose, CA (US); Kai-Cheng Chou, San Jose, CA (US)

(73) Assignee: Hynix Semiconductor America, Inc., San Jose, CA (US)

( * ) Notice: Subject to any disclaimer, the term of this patent is extended or adjusted under 35 U.S.C. 154(b) by 181 days.

(21) Appl. No.: 09/927,303

(22) Filed: Aug. 10, 2001

(65) Prior Publication Data

US 2003/0032239 A1 Feb. 13, 2003

(51) Int. Cl.[7] ............................................. H01L 21/336
(52) U.S. Cl. ........................ 438/257; 438/258; 438/259; 438/260
(58) Field of Search ................................. 438/257, 258, 438/259, 260

(56) References Cited

U.S. PATENT DOCUMENTS 5,641,696 A * 6/1997 Takeuchi ................... 438/257
6,051,465 A * 4/2000 Kato et al. ................. 438/258
6,071,775 A * 6/2000 Choi et al. ................. 438/257

* cited by examiner

*Primary Examiner*—David Nelms
*Assistant Examiner*—Renee R. Berry
(74) *Attorney, Agent, or Firm*—Townsend and Townsend and Crew LLP; Steven J. Cahill

(57) ABSTRACT

Structures and methods for flash memory transistors are formed with self-aligned drain/source contacts. The flash transistors are formed with a plurality of gate layers. An etch resistant layer(s) are deposited on top of the gate layers in the memory array transistors and on the gate layers of peripheral transistors. An additional oxide layer/spacer may be formed on the etch resistant layer to control the resulting transistor junction configuration. As a result within the same process various transistors may be formed satisfying various requirements. Contact holes to the drain and source regions of the memory and peripheral transistors are then formed. The etch resistant layer prevents the contact etchants from completely etching away the protective etch resistant layer surrounding the gate layers. The spacing between the drain/source contacts and the gate layers can be greatly reduced increasing the density of the memory array transistors and reducing chip size.

30 Claims, 4 Drawing Sheets

PROCESSES AND STRUCTURES FOR SELF-ALIGNED CONTACT NON-VOLATILE MEMORY WITH PERIPHERAL TRANSISTORS EASILY MODIFIABLE FOR VARIOUS TECHNOLOGIES AND APPLICATIONS

BACKGROUND OF THE INVENTION

A layout view of a previously known floating-gate non-volatile memory cell transistor 10 in a memory array is shown in FIG. 1A. Cell transistor 10 is formed by the intersection of active area 13 and gate 12. Contact 11 is a contact to the drain or the source of cell 10 (e.g., in NOR architecture, contact 11 is usually the contact to the drain). Contact 11 is spaced a minimum-required distance away from gate 12 as shown in FIG. 1A. This minimum-required distance can be for instance 1000–1400 angstroms for 0.25 µm technology, and is dictated by the contact mis-alignment tolerance of a process technology.

Further details of prior art cell transistor 10 are shown in FIG. 2. FIG. 2 is a cross-section view of cell 10 along a vertical axis through contact 11 with respect to FIG. 1A, and a cross-section view of a periphery MOS transistor 20. An example of cell transistor 10 includes a stacked gate 13 including a tunnel oxide layer, a first polysilicon layer that comprises a floating gate, an oxide/nitride/oxide (ONO) composite layer, a second polysilicon layer 12 and a tungsten silicide (WSi$_x$) layer that comprise a control gate, and dielectric layers PE-TEOS, PE-Nitride, and ARC Oxynitride. Periphery transistor 20 includes gate layers 16 having a gate oxide, a second layer polisilicon, a tungsten silicide layer, and dielectrics layers PT-TEOS, PE-Nitride, and ARC Oxynitride. Stacked gate 13 may be formed using a gate mask and gate etch, followed by cell self-aligned mask and self-aligned etch (SAE). Next, drain and source regions including drain region 14 are formed for each of memory cell 10 array and peripheral transistor 20.

Oxide spacers including spacers 15A and 15B having a thickness in the range of 500–1400 A are formed adjacent to each gate stack 13 typically by depositing a high temperature oxide (HTO) layer and etching back. Spacer 15A is part of the spacing between each edge of gate stack 13 and the contact to drain 14. Gate to contact spacing is typically bigger than the spacer width, so that during the steps of contact mask and etch, the spacer width is preserved even considering contact mask misalignment.

A separate contact mask is used to form the contact to drain 14. After the contact mask is applied, etching is performed to form contact holes over the drain and source regions. In a typical NOR architecture, a contact to every source is provided, for instance in the case of source local interconnect using, for example, tungsten local interconnect (WLI). Otherwise, a contact to the source line can be provided using source pick-up for the row of every 8 or 16 cells. Due to contact mask misalignment, some of the drain contact holes may become offset from their desired location to the left or to the right in FIG. 2, causing portions of spacer 15A or 15B to be etched away. If all of spacer 15A or 15B is etched, the subsequently formed contact will make electrical contact with the adjacent gate(s), which prevents the transistor from operating in the desired manner. Thus, the gate-to-contact spacing should be wide enough to account for potential misalignment between gate and contact masks. The wide contact-to-gate spacing results in a larger cell size.

Spacer 15C is also formed adjacent to peripheral transistor 16, as shown in FIG. 2, at the same time spacers 15A and 15B are formed. Highly doped N+ or P+ source/drain regions such as region 17 are formed in previously formed LDD or DDD regions after the formation of spacer 15C. The width of spacer 15C determines the lateral spacing between the outer edge of the N+/P+ regions and an outer edge of the LDD or DDD regions. This spacing is labeled as "x" in FIG. 2. Spacer 15C must be wide enough (e.g., ~1000–1400 angstroms for 0.25 µm technology, 3V power supply) to provide for the necessary lateral distance "x" between the outer edge of the low doped drain (LDD) region and its inner N+/P+ region in low voltage transistors (or the outer edge of the double doped drain (DDD) region and its inner N+/P+ region in high voltage transistors) to assure a high breakdown voltage and robust hot carrier injection reliability performance.

Depending on different factors such as the process technology, the application for the memory, and the required operating supply voltages, the spacing "x" needs to be varied. For example, where the memory is to be used in a portable device operating on a 2 v supply voltage, the spacing "x" can be made smaller for the low voltage transistors, while in the case of a 3 v operating supply voltage, the spacing needs to be increased. If smaller spacing "x" is used for higher supply voltages, e.g. same "x" for 3V as for 2V operation, the transistor may require longer channel length to improve HEI (hot electron injection) reliability. That in turn will decrease transistor drive current and overall performance. Accommodating such variations in a single process technology results in a complex process technology with multiple types of periphery transistors with different layout design rules (LDR). Such complex process technology increases manufacturing cost while complicating the circuit design process, because similar transistor blocks (circuits) with different LDR will have to be laid out separately for products with different power supply voltages.

It would therefore be desirable to reduce the width of the spacers along the side walls of the cell gate stack to reduce the cell size, while a mechanism is provided to allow varying the spacing "x" without unduly complicating the process steps, all in a self-aligned-contact non-volatile memory cell technology. This is also desirable for embedded applications, because accommodating various requirements for various transistors can be made easier.

BRIEF SUMMARY OF THE INVENTION

The present invention provides structures and methods for flash memory transistors that are formed with self-aligned drain/source contacts. The flash transistors are formed with a plurality of gate layers. An etch resistant layer is deposited on top of the gate layers in the memory array transistors and on the gate layers of peripheral transistors. An additional oxide spacer may be formed on the etch resistant layer to control the implantation of highly doped N+/P+ source and drain diffusion regions. Contact etching is then performed to form contact holes to the drain and source regions of the memory and peripheral transistors. The etch resistant layer prevents the contact etchants from completely etching away the protective etch resistant layer surrounding the gate layers of the transistors. Therefore, the drain/source contacts when formed do not make electrical contact with the gate layers of the transistors, because enough of the etch resistant layer remains after etching to provide sufficient insulation. Thus, the drain and source contacts are self-aligned with the gates of the transistors.

The structures and methods for flash cell transistors and peripheral transistors of the present invention are advantageous, because the spacing between the drain/source contacts and the gate layers can be greatly reduced due to the self-aligned nature of the contact etching process. Therefore, spacing between the flash memory transistors can be reduced, providing a substantial increase in the density of the transistors in the memory array. Also, the thickness of the oxide layer deposited on top of the etch resistant layer can be chosen to optimize the channel length and the position of the N+/P+ drain/source diffusion regions in the peripheral transistors to maintain a high breakdown voltage and robust hot carrier injection reliability performance.

DETAILED DESCRIPTION OF THE INVENTION

Figure 1B:
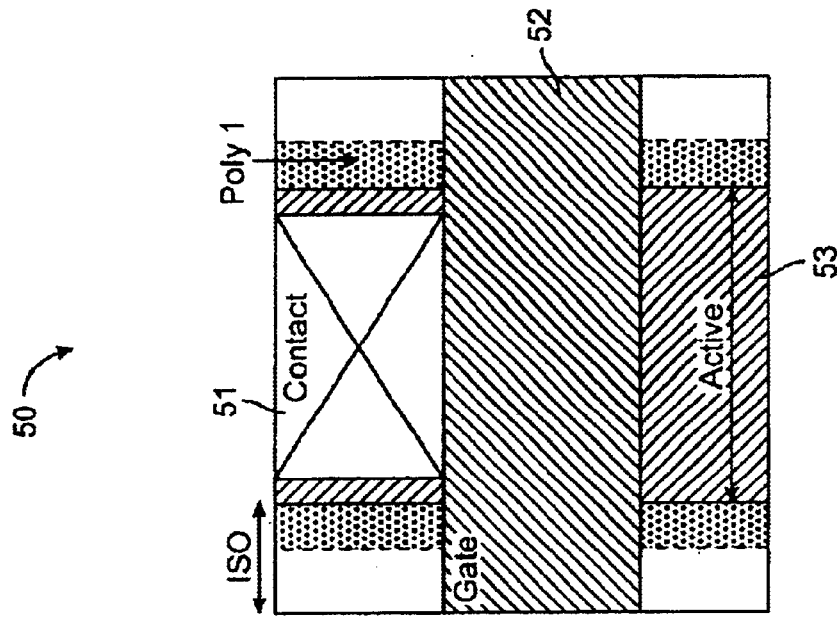
FIG. 1B depicts a top down layout view of a memory cell with a self-aligned contact in accordance with the present invention.
Figure 1A:
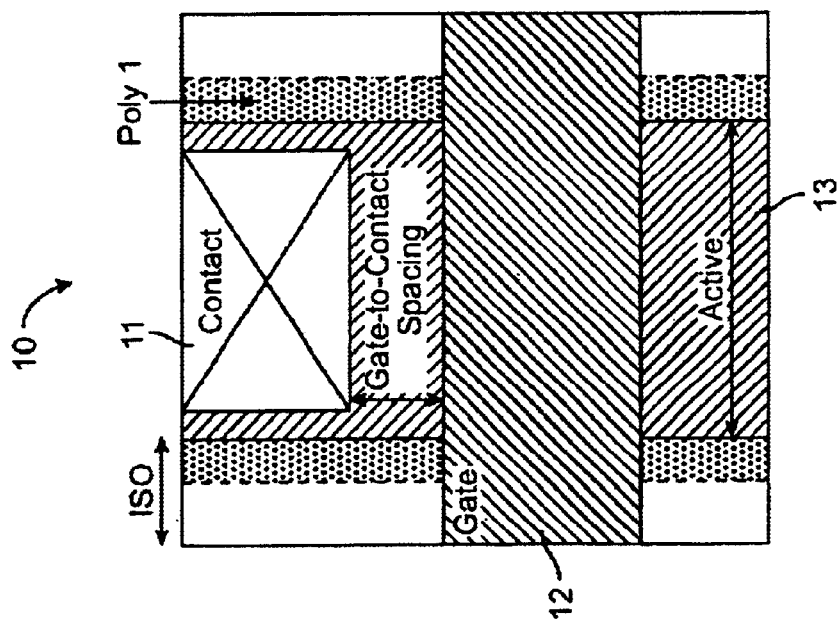
FIG. 1A depicts a top down layout view of a conventional memory cell.

A top down layout view of a non-volatile memory cell 50 formed in accordance with the principles of the present invention is shown in FIG. 1B. Cell 50 is formed at the intersection of active area 53 and control gate 52. Gate 52 is connected to the word line of the memory array, and drain contact 53 is connected to the bit line of the memory array. As shown, a contact area 51 is formed adjacent to gate 52 so that the gate-to-contact spacing is substantially reduced or eliminated. In one embodiment, contact 51 overlaps gate stack 52. Accordingly, a small cell size is obtained. This is achieved by using a self-aligned-contact process described further below.

Figure 3:
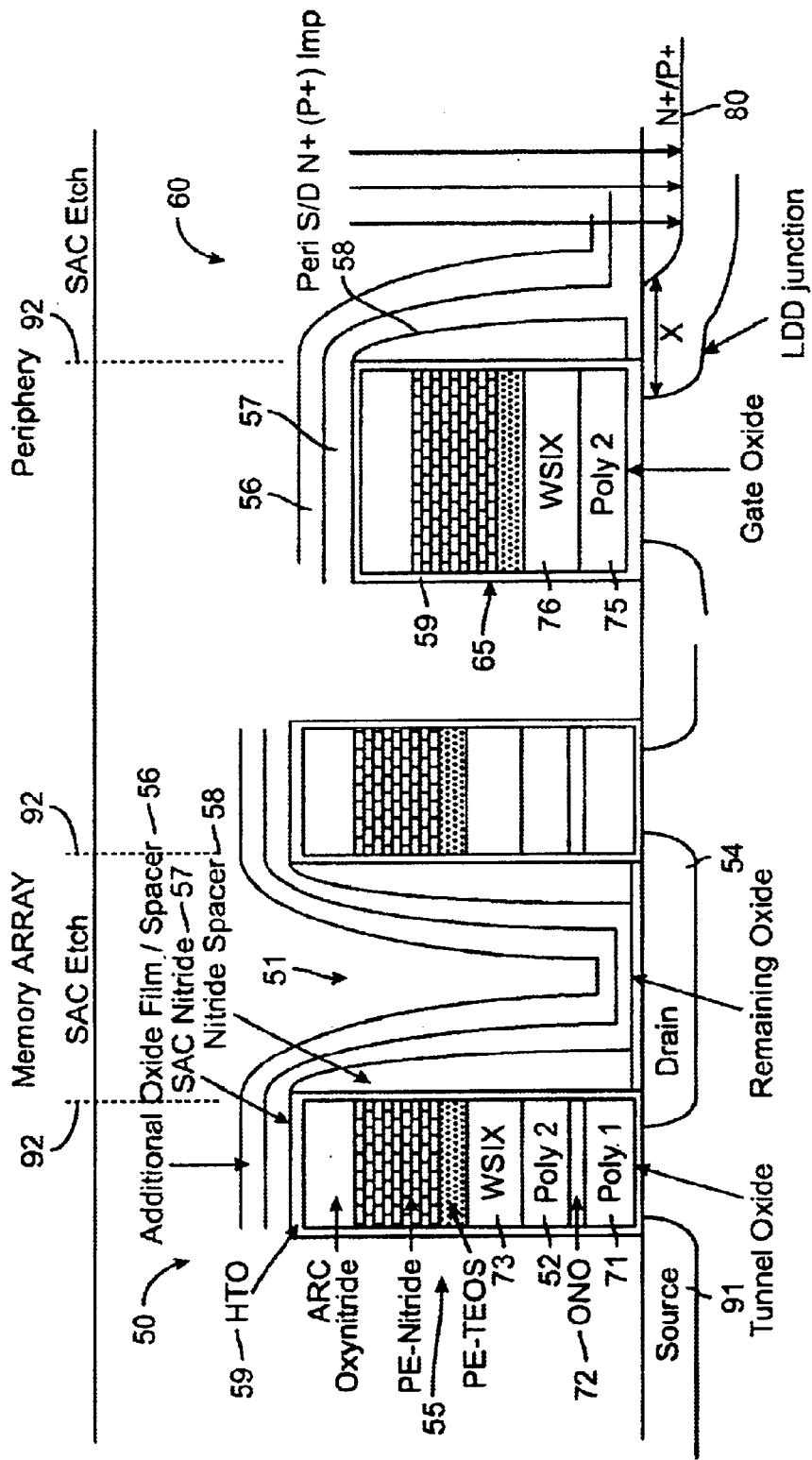
FIG. 3 is a cross sectional view of a first embodiment of a memory cell and a peripheral transistor in accordance with the present invention.

A vertical cross section of cell 50 and a peripheral transistor 60 in accordance with a first embodiment of the present invention are shown in FIG. 3. Gate stack 55 of cell 50 comprises a plurality of layers formed in accordance with well known techniques. Gate stack 55 may include a tunnel oxide layer, a first polysilicon layer 71 that comprises a floating gate, an ONO layer 72, a second polysilicon layer 52 that forms a control gate, a tungsten silicide layer WSi$_x$ layer 73, and dielectric layers PE-TEOS, PE-Nitride, and ARC Oxynitride. Peripheral transistor 60 includes gate layers 65 such as polysilicon layer 75 that forms the transistor gate (e.g., formed from the same layer as second polysilicon layer 52 in stack 55), tungsten silicide layer WSi$_x$ layer 76, and dielectric layers PE-TEOS, PE-Nitride, and ARC Oxynitride. In other processes CoSix (cobalt silicide) can be used instead of WSix. In some other processes, a W (tungsten) gate can be employed. The exact composition and sequence of gate and dielectric materials can vary.

A high temperature oxide (HTO) film 59 (e.g., 100–150 angstroms thick) may optionally be deposited on gate stack 55 in the memory array and gate layers 65 of peripheral transistor 60. HTO film 59 helps prevent charge loss in the memory cell.

In an alternate embodiment, the same objective is achieved by performing an oxidation cycle after the gate stack formation to form oxide film along the side of the first and second polysilicon layers. In this embodiment, HTO film 59 may be used in addition to the above poly re-oxidation, or can be eliminated.

After forming HTO film 59, a nitride film (e.g., at a thickness of 200–600 angstroms) is deposited over cell 50 and transistor 60. A nitride etch is then performed to form nitride spacers 58 along sidewalls of cell gate stack 55 and transistor 60 gate layers 65 as shown in FIG. 3. An additional layer 57 of nitride (e.g., at a thickness of about 150–200 angstroms) is deposited over cell 50 and transistor 60. If desired, nitride layers 57 and 58 may be deposited as one nitride layer.

Nitride layer 57 and spacer 58 protect gate stack 55 and gate layers 65 during the subsequent contact etch. Nitride is mostly resistant to the chemicals used to perform the contact etch. Therefore, nitride is considered to be an etch resistant layer with respect to the contact etch in the context of the present invention. However, some or all of the nitride layer 57 is removed during the contact etch. Therefore, layer 57 is considered to be a sacrificial layer, because it is substantially removed during the subsequent contact etch. If desired, other layers that are resistant to the contact etch may be used instead of nitride layer 57 and spacer 58.

Prior to forming HTO film 59, drain and source regions are implanted and diffused in cell 50 to form drain region 54 and source region 91. The periphery transistor 60 may receive a LDD implant in the source and drain regions to form LDD regions for a low voltage MOS transistor or may receive a DDD implant to form DDD regions for a high voltage MOS transistor. In one embodiment, the cell drain and source regions and the peripheral transistor DDD or LDD regions are formed after the deposition of HTO film 59 and before the formation of nitride spacer 58. In this embodiment, the thickness of HTO film 59 influences the position of the cell drain/source regions and the position of peripheral transistor LDD or DDD regions, thus influencing the corresponding effective channel lengths. Accordingly, the thickness of HTO film 59 can be modified to obtain the desired cell 50 and/or transistor 60 effective channel length.

In yet another embodiment, drain and source regions of the cell and the LDD or DDD regions of the peripheral transistor may be formed after the formation of nitride spacer 58 or even after forming sacrificial nitride layer 57. In this embodiment, the width of spacer 58 (and/or nitride layer 57) can be used, to obtain the desired effective channel length of the resulting transistor.

In one embodiment, highly doped N+ (for NMOS transistors) and P+ (for PMOS transistors) drain/source regions (such as region 80 in FIG. 3) are formed in the semiconductor active area after the formation of sacrificial nitride layer 57. In this embodiment, the lateral spacing "x" between the N+/P+ regions and the corresponding LDD or DDD regions is determined by the combined thickness of HTO layer 59, spacer 58, and sacrificial layer 57 given that the LDD and DDD regions are formed before forming HTO layer 59. The lateral spacing "x" may be reduced by forming the LDD/DDD after forming HTO layer 59 or after forming spacer 58. Alternatively, spacing "x" may be reduced by forming the N+/P+ regions before forming sacrificial layer 57. Other combinations to vary spacing "x" would be obvious to one skilled in this art. The term "x" herein refers not only to the lateral distance between the N+(P+) diffusion regions and the lateral junction position determined by the LDD/DDD implants, but also more broadly the junction configuration in the active area of transistors, including 2D (2-dimensional) doping and doping gradient configurations.

In one embodiment, the thickness of each of spacer 58 and sacrificial layer 57 is made relatively small in order to obtain a small cell size. In this embodiment, the lateral distance "x" between the N+/P+ regions and the LDD or DDD regions is reduced, resulting in a higher lateral doping gradient. This may lead to a lower junction breakdown voltage and impair hot carrier injection reliability. While the LDD, DDD, and N+/P+ implants may be optimized to alleviate problems with hot carrier injection and reduced breakdown voltage, such optimization may not be sufficient to satisfy all of the electrical requirements. In particular, hot carrier injection reliability problems in short channel low voltage transistors cannot be easily resolved just by optimization of LDD or DDD implants, especially for higher power supply voltages, e.g., 3 volts instead of 2 volts.

To eliminate the junction breakdown and hot carrier injection problems, an additional oxide film 56 is provided as shown in FIG. 3. Oxide film 56 is deposited on the cell and the periphery transistor after the deposition of sacrificial nitride layer 57. Oxide film 56 may have, for example, a thickness of 300–800 angstroms. Actual thickness may vary depending on requirements on junction engineering for various transistors.

N+/P+ dopants are implanted and diffused into the source and drain regions of the transistor after the formation of oxide film 56 to form N+/P+ regions 80 of the source and drain. Oxide film 56 increases spacing "x" by an amount approximately equal to the thickness of oxide film 56, thus, increasing the breakdown voltage and improving hot carrier injection reliability to the required levels in the peripheral transistors.

The combination of HTO layer 59, spacer 58, sacrificial layer 57, and oxide layer 56 provide great flexibility in forming in the various peripheral transistors which can be independently optimized within the same process. Further, the N+/P+ regions for various transistors can be formed in between the deposition of a plurality of layers of oxide film deposited on top of one another to independently optimize the spacing of "x" in different transistors.

N+/P+ regions may be formed in the source and the drain regions of the memory cell after the deposition of oxide film 56 at the same time the N+/P+ regions 80 are formed in the peripheral transistors or before the formation of oxide film 56 and N+/P+ regions 80, depending on the electrical requirements of the memory cells.

A contact mask 92 is used to define the contact holes, and then a contact etch is performed to form the contact holes. The contacts to the drain and the source regions of the cell and the transistor are subsequently formed in the contact holes. During the contact etch, oxide film 56 and some or all of sacrificial nitride layer 57 are removed. However, the thickness of nitride spacer 58 remains substantially intact following the contact etch. Therefore, nitride layer 58 (which is mostly resistant to the contact etch chemicals) insulates cell gate stack 55 and transistor gate layers 65 so that the drain/source contacts, when formed, do not make electrical contact with polysilicon layers 71, 52, 75 in the memory array and periphery. If contact mask 92 is misaligned (e.g., offset to the left or right in FIG. 3), nitride spacer 58 is not etched away, because it is substantially etch resistant. Hence, mask 92 is a self-aligned-contact as a result of spacer 58.

Figure 2:
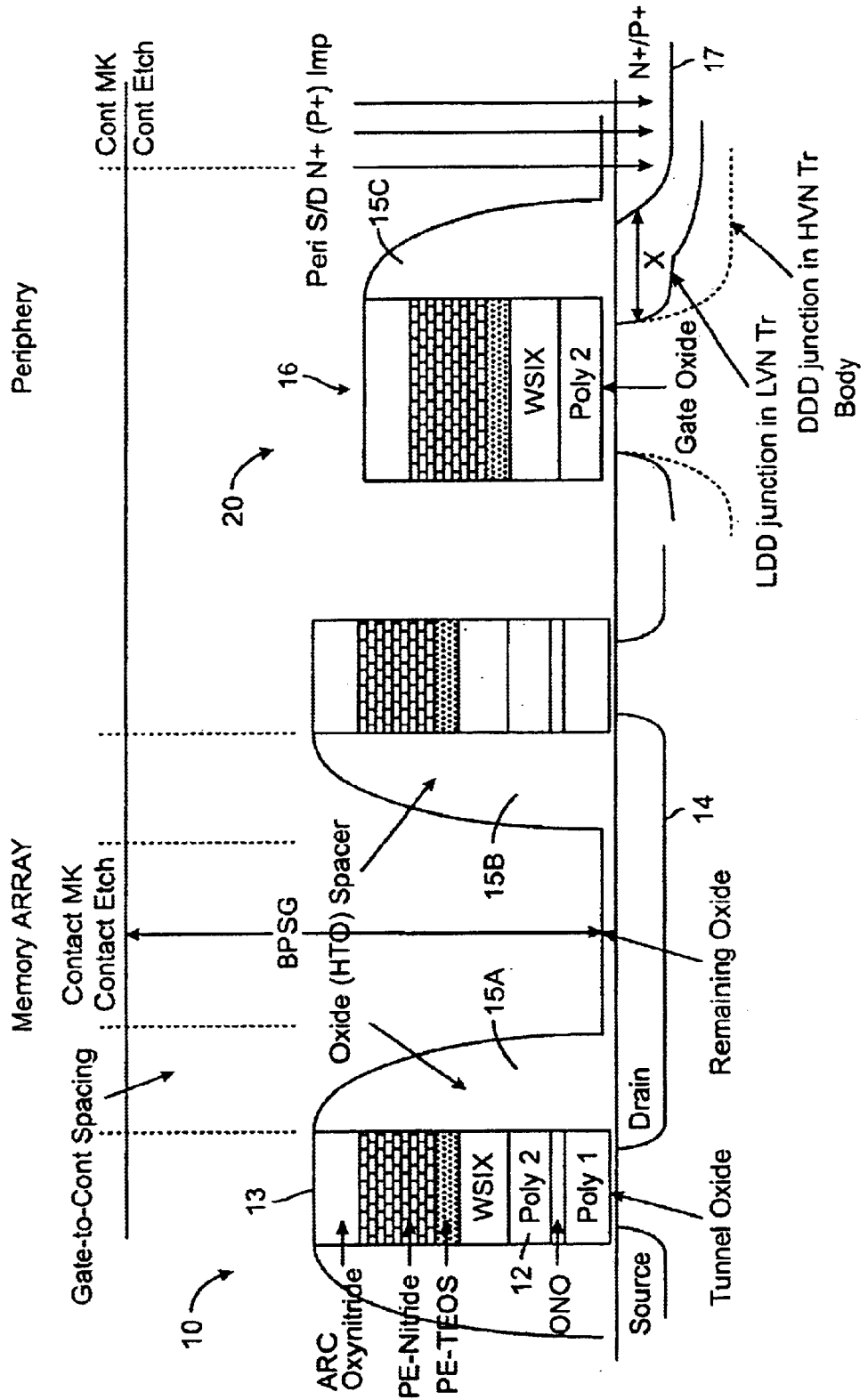
FIG. 2 is a cross sectional view of a conventional memory cell and a peripheral transistor.

The drain/source contacts are self-aligned with respect to the memory cell gate stack and peripheral transistor gate layers, because they are offset from the cell gate stack and transistor gate layers by the same distance (i.e., the thickness of nitride spacer 58) regardless of misalignments in the contact mask. Thus, nitride layer 57 and spacer 58 act as a hard mask for the contact area etch, eliminating problems caused by the contact mask being misaligned. Nitride spacer 58 separates the drain/source contacts from the gate stacks by, e.g., 200–600 angstroms, which is substantially less than prior art cell 10 in FIG. 2. For example, prior art cell 10 may have a 1500 angstroms gate-to-contact separation for 0.25 μm technology, which is determined by gate-to-contact spacing requirements (accounting for misalignment) to ensure integrity of the gate stack.

The reduction in the thickness of the insulating spacer between each of the cell gate stack and transistor gate layers and the drain/source contact reduces the dimensions of the memory cell and periphery transistor so that the memory cell and peripheral transistors can be scaled down to increase the memory density. The peripheral transistors may optionally have drain/source contacts that are also self-aligned with nitride spacers surrounding the gate layer, as shown in FIG. 3.

The width of contact holes 51 are big enough to ensure a sufficiently large contact hole at the silicon interface for a reliable contact with the drain/source regions and lower contact resistance. The width of nitride spacer 58 can be further reduced to increase the actual drain/source contact spacing at the silicon interface. If the memory cells are scaled down further, the width of nitride spacer 58 can be reduced to maintain an adequate drain/source contact spacing at the silicon interface.

Figure 4:
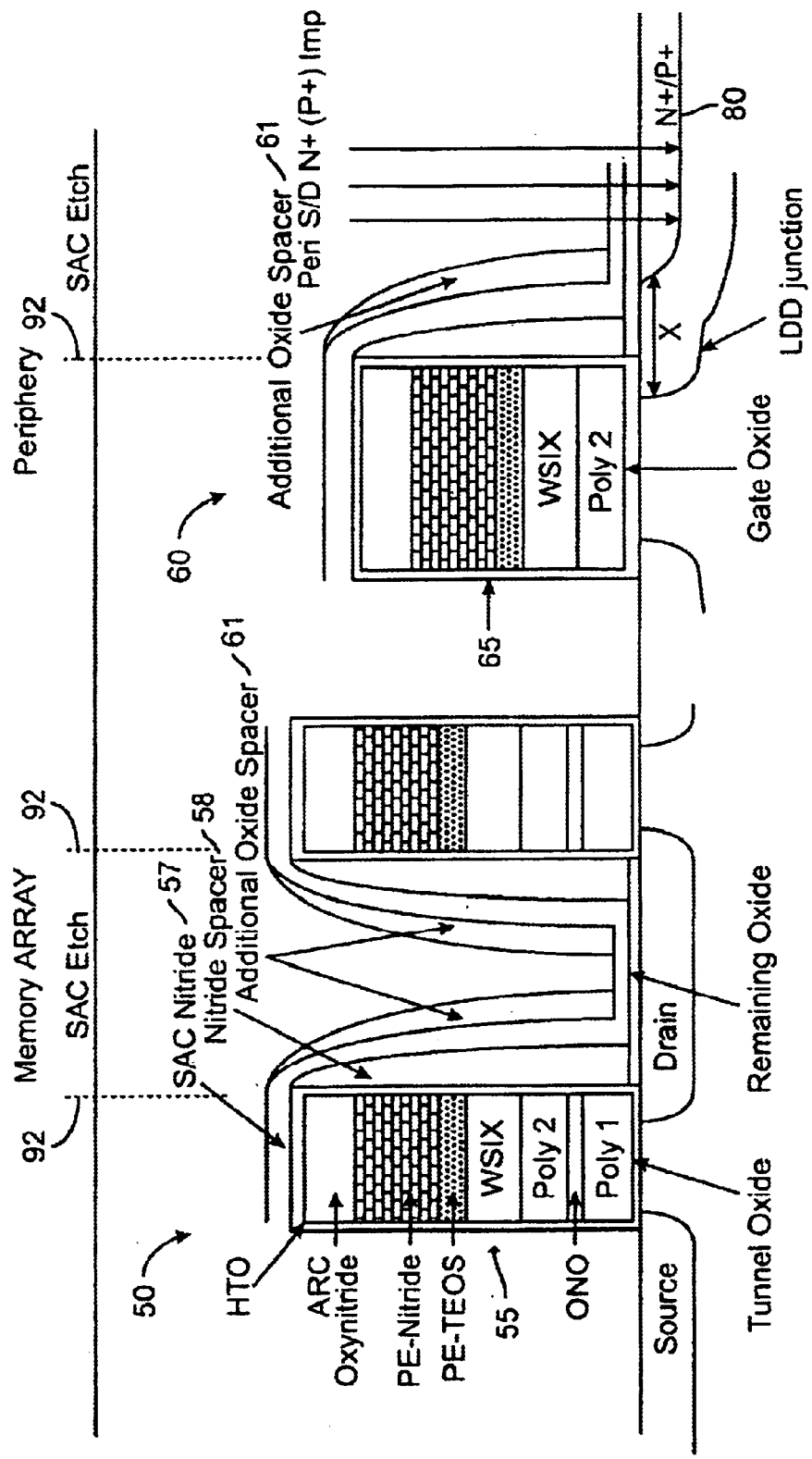
FIG. 4 is a cross sectional view of a second embodiment of a memory cell and a peripheral transistor in accordance with the present invention.

A further embodiment of the present invention is shown in FIG. 4. In the embodiment of FIG. 4, oxide film 56 may be deposited over sacrificial nitride layer 57 as discussed above. An additional etch is then performed in the memory cells and peripheral transistors to form oxide spacers 61 as shown in FIG. 4. The implant dose and implant energy for the N+/P+ regions should be selected to account for whether or not the additional etch back of oxide film 56 is performed. In the case where oxide film 56 is etched back as in FIG. 4 (i.e., N+/P+ implant is performed in the absence of oxide film 56 over the source/drain regions), lower dopant implant energies are required to implant N+/P+ source/drain regions 80 than in the case where oxide film 56 is not etched back as in FIG. 3 (i.e., N+/P+ implant is performed through oxide film 56 present over the source/drain regions).

Thus, the reduced width spacers 58 provide a smaller cell size, a more reliable silicon-to-contact interface, and lower contact resistance due to larger contact spacing. Memory cells and peripheral transistors formed in accordance with the present invention may be independently optimized with respect to their LDD and DDD junction configurations to provide higher breakdown voltages and better hot carrier injection reliability for a given power supply voltage. For example, the spacers in the memory cells can be reduced to reduce the cell size, while at the same time the spacing "x" in the peripheral transistors is increased using oxide layer 56 to optimize hot carrier injection and breakdown voltage considerations.

The processes of the present invention are desirable, because they provide these advantages without the need for additional mask layers. However, the invention is not limited as such. Additional masking layers may be used in combination with the above-described techniques to achieve further flexibility and advantages. The processes of the present invention also may not require changes in process design rules. Different products can be designed for different applications with the same set of design rules. For example the ability to form different periphery transistors and memory cells with minimal process changes allows embedding a memory device formed in accordance with the present invention in different applications with varying process technologies. Further, the invention is not limited to stacked gate cells. The features and advantages of the present invention may also be realized by modifying the above-described techniques for any floating-gate non-volatile cell technology such as split-gate cell, source-side-injection cell, and triple-poly cell, etc.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth. Therefore, many modifications may be made to adapt a particular situation or material to the teachings of the invention without departing from the essential scope and spirit of the present invention. It is intended that the invention not be limited to the particular embodiments disclosed, but that the invention will include all embodiments and equivalents falling within the scope of the claims.

What is claimed is:

1. A method for forming a non-volatile memory cell transistor in an array region, the method comprising:
    forming a gate stack of the memory cell transistor in the array region;
    forming source and drain regions of the memory cell transistor;
    forming a spacer along one or more side-walls of the gate stack;
    defining a contact hole area over one or both of the drain and source regions of the memory cell transistor using a masking layer, wherein the contact hole area substantially abuts or overlaps the gate stack; and
    performing a contact etch to form a contact hole in the contact hole area, wherein at least a portion of the spacer is not removed during the contact etch to provide insulation to the side-walls of the gate stack.

2. The method of claim 1 further comprising:
    forming a sacrificial layer over the spacers, the cell gate stack, and the transistor gate.

3. The method of claim 2 wherein the spacer and the sacrificial layer comprise nitride.

4. The method of claim 2 wherein the contact etch removes part or all of the sacrificial layer.

5. The method of claim 1 further comprising:
    forming one of LDD and DDD regions in the memory cell transistor after the spacer is formed.

6. The method of claim 1 wherein the spacer is insulated from the side-walls of polysilicon layers in the gate stack.

7. The method of claim 1 further comprising:
    forming an HTO layer over the gate stack.

8. The method of claim 7 wherein the source and drain regions of the memory cell are formed after the HTO layer forming act.

9. The method of claim 5 further comprising:
    forming an oxide layer over the spacers and the gate stack;
    performing an oxide etch to remove at least portions of the oxide layer over the drain and source regions of the transistor; and
    forming a highly doped region in one of the LDD or DDD regions, wherein a lateral distance between an outer edge of the highly doped diffusion region and an outer edge of a corresponding one of the LDD and DDD regions is dependent at least on a thickness of the oxide layer.

10. The method of claim 1 further comprising:
    prior to the spacer forming act, forming a DDD region in the source or drain region of the cell; and
    after the spacer forming act, forming a highly doped region in the DDD region.

11. The method of claim 1 wherein the memory cell is one of a split-gate cell and an ETOX stacked-gate cell.

12. A method for forming a non-volatile memory cell transistor in a memory array, the method comprising:
    forming a plurality of gate layers on a semiconductor region;
    forming first spacers adjacent to the gate layers in the memory array;
    exposing the first spacers to a contact hole etch to form a contact hole to a drain or source region of the memory array transistor, wherein at least a portion of each of the first spacers is not removed during the contact hole etch; and
    depositing a conductive layer on the memory cell transistor to form a contact to the drain or source region of the memory cell transistor, wherein the contact does not electrically connect to the gate layers of the memory cell transistor.

13. The method of claim 12 further comprising:
    depositing a high thermal oxide film over the gate layers before the deposition of the first spacers.

14. The method of claim 2 further comprising:
    forming an oxide film over the first spacers; and
    etching the oxide film to remove a portion of the oxide film adjacent to the semiconductor region.

15. The method of claim 12 wherein the first spacers are formed by depositing and etching a nitride layer, wherein the nitride layer is substantially resistant to the contact hole etch.

16. The method of claim 12 further comprising:
    depositing a nitride layer over the first spacers, after forming the first spacers.

17. The method of claim 16 wherein portions of the nitride film are removed during the contact hole etch.

18. The method of claim 12 wherein the first spacers have a width between 100–700 angstroms.

19. The method of claim 12 further comprising:
    forming a transistior in a region peripheral to the memory array; and
    forming a low doped drain region in the peripheral transistor before forming the first spacers adjacent to the gate layers.

20. The method of claim 12 further comprising:
    forming a transistor in a region peripheral to the memory array; and
    forming a double doped drain region in the peripheral transistor before forming the first spacers adjacent to the gate layers.

21. The method of claim 12 wherein a transistor is formed in a region peripheral to the memory array and drain and source diffusion regions in the peripheral transistor are formed by depositing a first concentration of dopants within second drain and source diffusion regions in the peripheral transistor that are doped with a second concentration of dopants lower than the first concentration of dopants.

22. A method for forming a device comprising a plurality of transistors in a flash memory array, the method comprising:

forming a plurality of gate layers on a semiconductor region;

forming first spacers adjacent to the gate layers of the transistors in the flash memory array;

forming a contact mask over the plurality of gate layers that is aligned with edges of the gate layers; and performing a contact hole etch to form contact holes to drain or source regions of the memory array transistors, wherein at least a portion of the first spacers are not removed during the contact hole etch such that the first spacers insulate lateral walls of the gate layers in the memory array transistors subsequent to the contact hole etch.

23. The method of claim 22 further comprising:

depositing a high thermal oxide film over the gate layers before the formation of the first spacers.

24. The method of claim 22 further comprising:

depositing a second film over the first spacers;

depositing an oxide film over the second film;

forming drain and source diffusion regions in transistors located in a peripheral region of the device; and etching the oxide film prior to forming said drain and source diffusion regions in the peripheral region transistors to remove a portion of the oxide film adjacent to the semiconductor region.

25. The method of claim 22 wherein the first spacers are formed by depositing and etching a nitride layer, wherein the nitride layer is substantially resistant to the contact hole etch.

26. The method of claim 24 wherein the second film is formed by depositing a nitride layer.

27. The method of claim 26 wherein portions of the second are removed during the contact hole etch.

28. The method of claim 22 wherein the first spacers are between 100–700 angstroms wide.

29. A method for forming a non-volatile memory cell transistor in a memory array and a transistor in a region peripheral to the memory array, the method comprising:

forming a plurality of gate layers on a semiconductor region;

forming first spacers adjacent to the gate layers of the memory cell transistor and the transistor in the peripheral region; and masking and etching the gate layers to form contact holes to drain or source regions of the peripheral and memory array transistors, wherein the first spacers are substantially resistant to the contact hole etch, and the first spacers insulate lateral walls of the gate layers in the memory array transistors and the peripheral region transistors subsequent to the contact hole etch.

30. The method defined in claim 29 further comprising:

depositing a second film over the first spacers;

depositing a first oxide film over the second film;

forming first drain and source diffusion regions in the peripheral region transistor;

depositing a second oxide film over the first oxide film; and forming second drain and source diffusion regions the peripheral region transistor.

* * * * *